(12) United States Patent
Kielwein et al.

(10) Patent No.: US 9,793,144 B2
(45) Date of Patent: Oct. 17, 2017

(54) WAFER HOLDER AND TEMPERATURE CONDITIONING ARRANGEMENT AND METHOD OF MANUFACTURING A WAFER

(75) Inventors: Juergen Kielwein, Rankweil (AT); Bart Scholte Von Mast, Azmoos (CH); Rogier Lodder, Bad Ragaz (CH)

(73) Assignee: EVATEC AG, Trübbach (CH)

( * ) Notice: Subject to any disclaimer, the term of this patent is extended or adjusted under 35 U.S.C. 154(b) by 694 days.

(21) Appl. No.: 13/220,903

(22) Filed: Aug. 30, 2011

(65) Prior Publication Data
US 2013/0052834 A1 Feb. 28, 2013

(51) Int. Cl.
*H01L 21/00* (2006.01)
*H01L 21/67* (2006.01)

(52) U.S. Cl.
CPC .............................. *H01L 21/67115* (2013.01)

(58) Field of Classification Search
CPC ......... H01L 21/68792; H01L 21/67115; C23C 16/4586
USPC ........................................................ 438/795
See application file for complete search history.

(56) References Cited

U.S. PATENT DOCUMENTS

| | | | | |
|---|---|---|---|---|
| 4,845,055 A | * | 7/1989 | Ogata | 438/308 |
| 5,228,501 A | * | 7/1993 | Tepman | C23C 14/50 118/69 |
| 6,007,635 A | * | 12/1999 | Mahawili | 118/728 |
| 6,022,413 A | * | 2/2000 | Shinozaki et al. | 118/715 |
| 6,645,344 B2 | * | 11/2003 | Caldwell et al. | 156/345.53 |
| 6,658,895 B2 | * | 12/2003 | Lieberman et al. | 65/374.15 |
| 7,396,746 B2 | * | 7/2008 | Walther et al. | 438/515 |
| 2003/0070915 A1 | * | 4/2003 | Kao | 204/192.12 |
| 2003/0094446 A1 | * | 5/2003 | Tay | H01L 21/67115 219/411 |
| 2005/0053369 A1 | * | 3/2005 | Yoo | 392/416 |
| 2006/0249695 A1 | * | 11/2006 | Choi | 250/492.2 |
| 2008/0276860 A1 | * | 11/2008 | Burrows et al. | 117/102 |
| 2009/0101633 A1 | * | 4/2009 | Aggarwal et al. | 219/385 |
| 2009/0179365 A1 | * | 7/2009 | Lerner | B25B 11/005 269/21 |
| 2010/0111511 A1 | * | 5/2010 | Merry et al. | 392/411 |

\* cited by examiner

*Primary Examiner* — Gordon R Baldwin
*Assistant Examiner* — Charlee Bennett
(74) *Attorney, Agent, or Firm* — Pearne & Gordon LLP

(57) ABSTRACT

A wafer holder and temperature controlling arrangement has a metal circular wafer carrier plate, which covers a heater compartment. In the heater compartment a multitude of heater lamp tubes is arranged, which directly acts upon the circular wafer carrier plate. Latter is drivingly rotatable about the central axis. A wafer is held on the circular wafer carrier plate by means of a weight-ring residing upon the periphery of a wafer deposited on the wafer carrier plate.

23 Claims, 3 Drawing Sheets

WAFER HOLDER AND TEMPERATURE CONDITIONING ARRANGEMENT AND METHOD OF MANUFACTURING A WAFER

The present invention is directed on a wafer holder and temperature conditioning arrangement, also called throughout the present description "chuck arrangement", as well as on a method of manufacturing a coated wafer making use of such chuck arrangement.

Chuck arrangements, by which silicon wafers are positioned and held during processing in a vacuum processing chamber and are temperature conditioned during such processing, are widely known. Thereby, vacuum processing may include physical vapour deposition processes and/or chemical vapour deposition processes so as to perform layer deposition upon the wafer, may be etching upon the wafer or of the wafer, may be heating or cooling down the wafer.

Thereby, the wafer is commonly held upon the chuck arrangement by electrostatic forces or by means of a retaining weight-ring resting upon the periphery of the wafer being processed and biasing the wafer towards a wafer carrier surface of the chuck arrangement by weight.

Depending upon the vacuum pressure establishing in the vacuum processing chamber heat transfer from the chuck arrangement to the wafer or inversely is predominantly governed by radiation. It is commonly known to establish between the carrier surface of the chuck arrangement and the surface of the wafer residing on the addressed surface a gas cushion at an increased pressure with respect to vacuum pressure of the wafer surrounding processing atmosphere so as to add to the addressed heat transfer by radiation, heat transfer by heat conductions.

In context with manufacturing and selling the CLN 300 vacuum processing planed by OC Oerlikon Balzers a rotating chuck arrangement has become known with a structure which shall be explained with the help of FIG. 1. This figure shows schematically and highly simplified the structure of such prior art rotating chuck arrangement. The main function of the addressed rotating chuck arrangement is to allow the use of a sputtering source with multiple targets. The rotation of the chuck arrangement and thus of the wafer positioned and held upon such arrangement ensures that the layer, that is created, is uniform.

The wafer holder and temperature conditioning arrangement 1 also called chuck arrangement 1, comprises a base arrangement 3 to be mounted to the wall 5 of a vacuum processing chamber with processing space P. The base arrangement 3 has, pointing towards the processing space P, with a pattern of protruding ribs 7 concentric about a central axis A of the overall chuck arrangement 1. Within the base arrangements 3, there is provided, again concentrically to axis A, a heater compartment 9 as a ring shaped chamber wherein four heater lamp tubes 11 are mounted and operated. The heater lamp tubes 11 are each distinctly located in the heater compartment 9 with different spacing's from axis A and with different angular orientations with respect to radial direction r from axis A to the circular periphery-wall of the heater compartment 9. In operation, the heater compartment 9 and thus the heater lamp tubes 11 are in vacuum within the processing chamber. The concentric pattern of protruding ribs 7 match with a pattern of respective circular grooves 13 worked one surface of a metal, circular wafer carrier plate 15. By the addressed patterns of ribs 7 and grooves 13, the effective surface for heat transfer between the base arrangement 3 and the metal, circular wafer carrier plate 15 is doubled. Additionally the base arrangement 3 as well as the metal, circular wafer carrier plate 15 is coated with a special black coating that absorbs heat radiation i.e. infrared radiation.

The metal, circular wafer carrier plate 15 is driven by means of a driver shaft 17 operationally connected to a servo motor 19. The driver shaft 17, coaxial to axis A, and the metal, circular wafer carrier plate 15 are electrically isolated from base arrangement 3 and from the wall 5 of the vacuum processing chamber and may thus (not shown) be operated at any desired electrical bias signal.

The driver shaft 17 further comprises a coaxial gas feed line 21, which, on one hand, is operationally connected to a gas source arrangement 23 and which abuts, on the other hand, in a gas outlet and gas diverting system 26 with gas distribution grooves 28 provided in the substantially plane surface 25 of the metal, circular wafer carrier plate 15 whereupon a wafer 27 to be processed is located in operation. The wafer 27 is retained upon the metal, circular wafer carrier plate 15 by means of a weight ring 29 which, by its proper weight, biases the wafer 27 towards and upon the addressed surface 25 of the metal, circular wafer carrier plate 15. By means of the gas feed system 21, 23, the gas outlet 26 and gas distribution grooves 28 in the addressed surface 25, there is established, in operation, a cushion of back gas at a pressure larger than the operating vacuum pressure in processing space P, which back gas cushion improves heat transfer from the metal, circular wafer carrier plate 15 towards or from wafer 27 by heat conductions.

The base arrangement 3 further comprises a piping of a cooling system 31 conceived to flow a liquid cooling medium in the base arrangement 3. Heat transfer from or to the wafer 27 from the heater compartment 9 or from the cooling system 31 with piping is performed over a solid material surface interface between base arrangement 3 to the metal circular wafer carrier plate 15 and from that plate 15 over of the back gas cushion to or from wafer 27. Thereby, thermical inertia especially of the base arrangement 3 do substantially contribute to the reaction time by which the temperature of wafer 27 reacts upon a heating or cooling step applied to the base arrangement 3. Depending upon the diameter of the wafer 27 two or four of the heater lamp tube 11 are enabled. The individual location of the heater lamp tube 11 within the heater compartment 9 is optimized to result, once thermal stability of the wafer 27 is reached in a homogenous temperature distribution along the wafer 27, which is rotated as shown in FIG. 1 by w, together with the metal, circular wafer carrier plate 15 and the weight-ring 29.

With the known arrangement as shown in FIG. 1, 300 mm or 200 mm silicon wafers may be processed. The maximum temperature that can be reached for the wafers is approximately 200° C. and thus the surface of metal, circular wafer carrier plate 15 may reach as well temperatures of approximately 200° C.

It is one object of the present invention to provide a wafer holder and temperature conditioning arrangement to be mounted to a vacuum wafer treatment chamber, which allows a large number of different wafer processings, thereby additionally simplifying the overall structure of the wafer holder and temperature conditioning arrangement as known and as was exemplified with the help of FIG. 1.

This is reached by the wafer holder and temperature conditioning arrangement to be mounted to a vacuum wafer treatment chamber, which comprises:

- a base arrangement with an extended, essentially plane surface, bordered by a protruding circular rim surface about the centre of the essentially plane surface;

a metal circular wafer carrier plate mounted centred with respect to the centre of the essentially plane surface, one surface of the metal circular wafer carrier plate, the extended, essentially plane surface and the protruding circular rim surface, commonly defining a heater compartment, the metal wafer carrier plate being drivingly rotatable about a geometric axis through the centre of the essentially plane surface with respect to the base arrangement;

a multitude of heater lamp tubes arranged in the heater compartment along the extended essentially plane surface and along the one surface of the metal circular wafer carrier plate and directly exposed to this surface and mounted to the base arrangement;

a wafer retaining arrangement operationally coupled to the metal circular wafer carrier plate.

Because of the fact that the metal circular wafer carrier plate itself forms one wall of the heater compartment, wherein the heater lamp tubes are provided, the metal circular wafer carrier plate is directly heated by the heater lamp tubes by radiation and very small thermal inertia exist between a wafer applied to the addressed wafer carrier plate and the heater lamp tubes. This significantly contributes to the fact that a very high maximum temperature as of at least 800° C. may be realised along the metal circular wafer carrier plate and thus along a wafer residing on the addressed carrier plate. In one embodiment of the wafer holder and temperature conditioning arrangement according to the present invention this arrangement comprises an electric power control unit, controlling power to the multitude of heater lamp tubes. This power control unit is conceived to operate the multitude of heater lamp tubes so as to establish along the other surface of the metal circular wafer carrier plate, opposite said one surface thereof, and thus whereupon in operation, the wafer resides, a maximum temperature of at least 800° C. averaged over the addressed other surface. Thereby, wafer processing and especially coating of wafer becomes possible in the vacuum wafer treatment chamber which where up to now not possible with known wafer holder and temperature conditioning arrangements. Additionally, the small thermical inertia between heater lamp tubes and wafer allow for a highly direct and low time lag temperature adjustment at the wafer.

Figure 1:
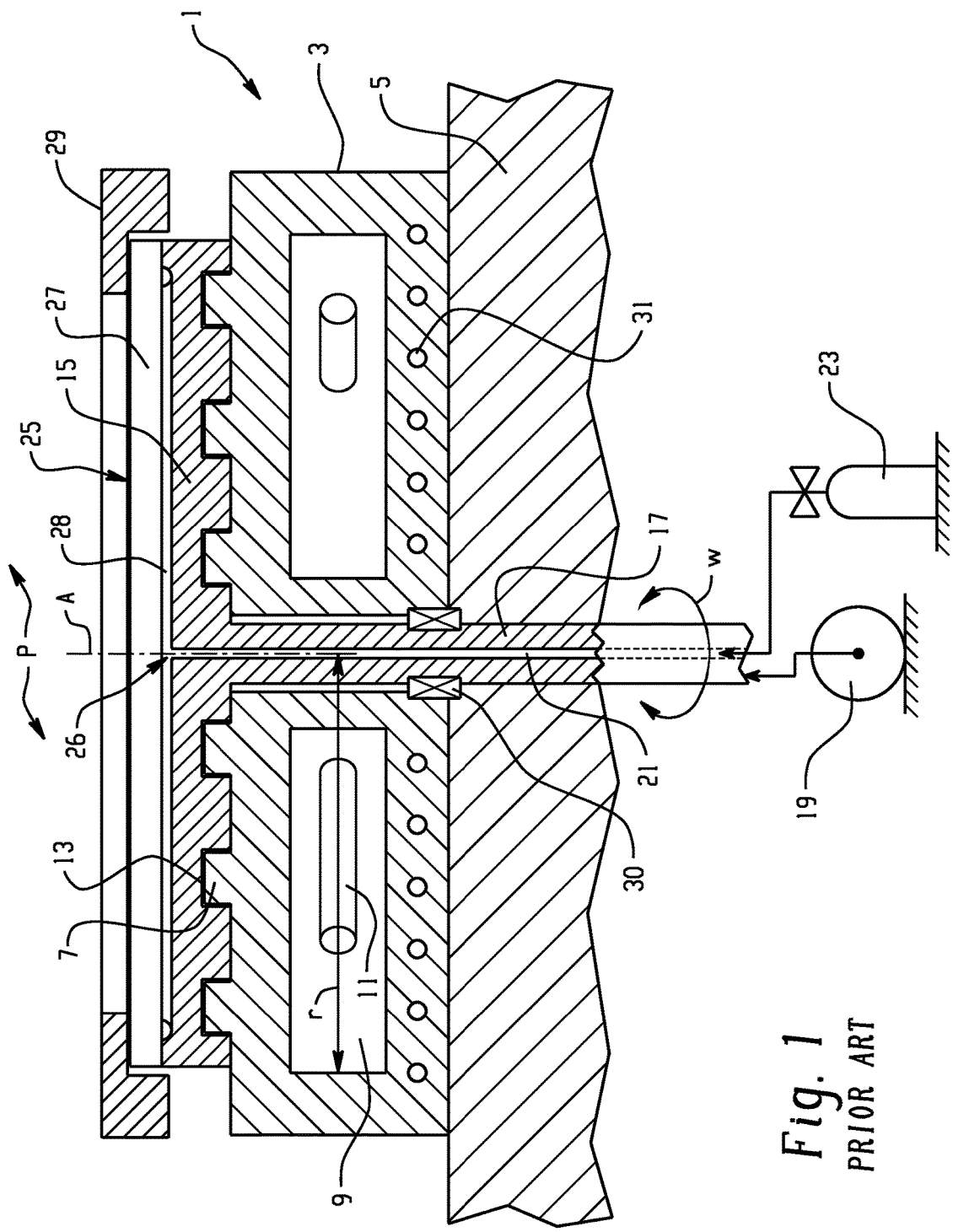

The wafer carrier plate is in a today's preferred embodiment drivingly rotatable about the geometric axis in that, as was shown in context with FIG. 1, a driver shaft is led through the base arrangement and coupled to the metal circular wafer carrier plate, which latter in today's preferred embodiment, is electrically isolated from the base arrangement to be operable at a desired electric bias potential.

The wafer retaining arrangement of today's preferred embodiment is realised as was shown in FIG. 1 also by means of a weight ring but could also be realised in a different manner as e.g. by permanent magnet and/or electro magnetic retaining members.

The fact that the heater compartment operated in vacuum atmosphere is directly exposed to the metal circular wafer carrier plate additionally reduces the constructional efforts.

In one embodiment of the invention, which may be combined with any of the previously and subsequently addressed embodiments unless in contradiction, the multitude of heater lamp tubes consist of a multitude of equal heater lamp tubes, which are mounted in the heater compartment equally oriented with respect to radial direction from the centre to the circular rim surface. Thereby, in a further embodiment, the length extent direction of the heater lamp tube is angularly offset with respect to the radial direction from the centre of the essentially plane surface towards the protruding circular rim surface.

In a further embodiment, which may be combined with any of the previously and subsequently addressed embodiments unless in contradiction, the position of at least a part of the heater lamp tubes in the heater compartment may be adjusted so as to optimize temperature distribution along a wafer disposed on the metal circular wafer carrier plate and rotated therewith and thus with respect to the heater lamp tubes.

Similarly to the explanation with respect to FIG. 1, also in one embodiment of the present invention, which may be combined with any of the previously and subsequently addressed embodiments, if not in contradiction, there is provided a gas outlet and dispensing arrangement through and along the other surface of the metal circular wafer carrier plate, which is that surface which is directly exposed to the wafer.

Also similarly to the explanations given in context with FIG. 1, one embodiment which may be combined with any of the already and the subsequently addressed embodiments, unless in contradiction, there is provided a piping arrangement in the base arrangement conceived to flow a liquid therein, a cooling liquid to cool down a processed wafer whenever necessary. Please note that due to small thermal inertia, the effect of such cooling upon the wafer according to the present invention is significantly faster than with the known arrangement as of FIG. 1.

Further, in one embodiment of the present invention, which may be combined with any of the already and the subsequently addressed embodiments, unless in contradiction, the wafer retaining arrangement is a weight-ring dimensioned so as to reside on the periphery of a wafer to be processed, whereby the weight-ring is preferably conceived to be electrically connected to an electric bias source.

In one further embodiment, which may be combined with any of the already and subsequently addressed embodiments, unless in contradiction, the heater lamp tubes have a thickness extent which fills the heater compartment between the extended essentially plane surface and the one surface of the metal circular wafer carrier plate without contacting these surfaces. In other words, the heater compartment thickness is practically filled by the thickness extent of the heater lamp tubes.

In one embodiment, which may be combined with any of the embodiments already and subsequently addressed, unless in contradiction, the extended essentially plane surface and the protruding peripherals circular rim surface are heat reflector surfaces, which are preferably high gloss polished. Thereby, the heat generated by the heater lamp tubes, heat up the base arrangement to only a restricted extent as being reflected by the addressed surface directly towards the metal circular wafer carrier plate. This embodiment is today highly preferred.

In a further embodiment of the present invention, which may be combined with any of the already and subsequently addressed embodiments, unless in contradiction, the metal circular wafer carrier plate is electrically isolated from the base arrangement and is preferably conceived to be electrically connected to an electric biasing source.

More specifically, the wafer holder and temperature conditioning arrangement of the present invention and in specific embodiments, which may be combined with any of the embodiments addressed above unless in contradiction, the wafer carrier plate is conceived for one of a 100 mm diameter wafer, whereby the multitude of heater lamp tubes consists of four 500 W halogen heater lamp tubes;

a 150 mm diameter wafer, whereby the addressed multitude consists of five 500 W halogen heater lamp tubes;

a 200 mm diameter wafer, whereby the multitude as addressed, consists of ten 250 W halogen heater lamp tubes.

The invention is further directed on a method of manufacturing a wafer coated with a layer, comprising providing in a vacuum process coating chamber a wafer holder and temperature conditioning arrangement, comprising:
  a base arrangement with an extended essentially plane surface, bordered by a protruding circular rim surface about the centre of the essentially plane surface;
  a metal circular wafer carrier plate centrally mounted with respect to the centre of the essentially plane surface, one surface of the metal circular wafer carrier plate, the extended, essentially plane surface and the protruding circular rim surface commonly defining a heater compartment, the metal circular wafer carrier plate being drivingly rotatable about a geometric axis through the centre of the essentially plane surface with respect to the base arrangement;
  a multitude of heater lamp tubes arranged in the heater compartment along the extended essentially plane surface and the one surface of the metal circular wafer carrier plate and directly exposed to the one surface of the metal circular wafer carrier plate and mounted to the base arrangement;
  a wafer retaining arrangement operationally coupled to the metal circular wafer carrier plate;
  an electric power control unit, controlling power to the multitude of heater lamp tubes and conceived to operate the multitude of heater lamp tubes so as to establish along the other surface of the metal circular wafer carrier plate, opposite the one surface thereof, a predetermined temperature, averaged over the other surface and, depositing on the other surface of the metal circular wafer carrier plate, a wafer to be coated;

drivingly rotating the metal circular wafer carrier plate, while operating the electric power control unit to heat up the wafer to at least 800° C. and;

depositing a layer on the wafer.

Thereby, in the frame of the addressed method, a wafer holder and temperature conditioning arrangement in any of the embodiments as addressed in context with such wafer holder and temperature conditioning arrangement according to the invention above may be applied. Further, if we talk about coating a "wafer", we understand applying a coating upon such wafer, which includes that between the silicon wafer and the coating to be applied one or more than one layer have already been applied.

In a preferred embodiment of the addressed method the layer as applied is of lead-zirconatetitanate, which is applied preferably by cosputtering lead, zirconium and titanium.

The invention shall now further be exemplified with the help of a further figure. Thereby, this further figure shows:

FIG. 1: A simplified and schematic view of a prior art rotating chuck arrangement.

Figure 2:
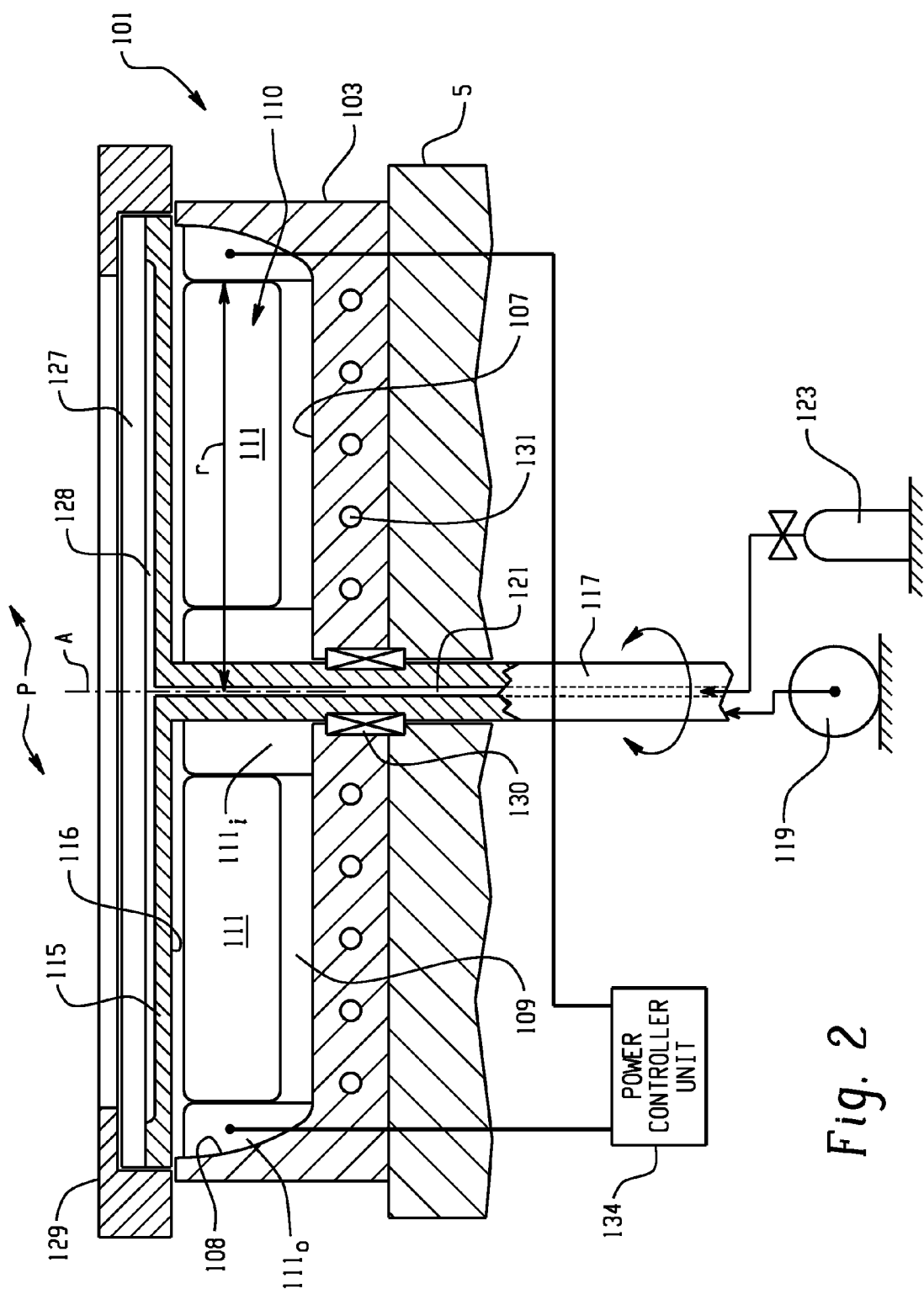

FIG. 2: In a representation in analogy to that of FIG. 1, a wafer holder and temperature conditioning arrangement according to the present invention, by which the method according to the present invention is realised.

Figure 3:
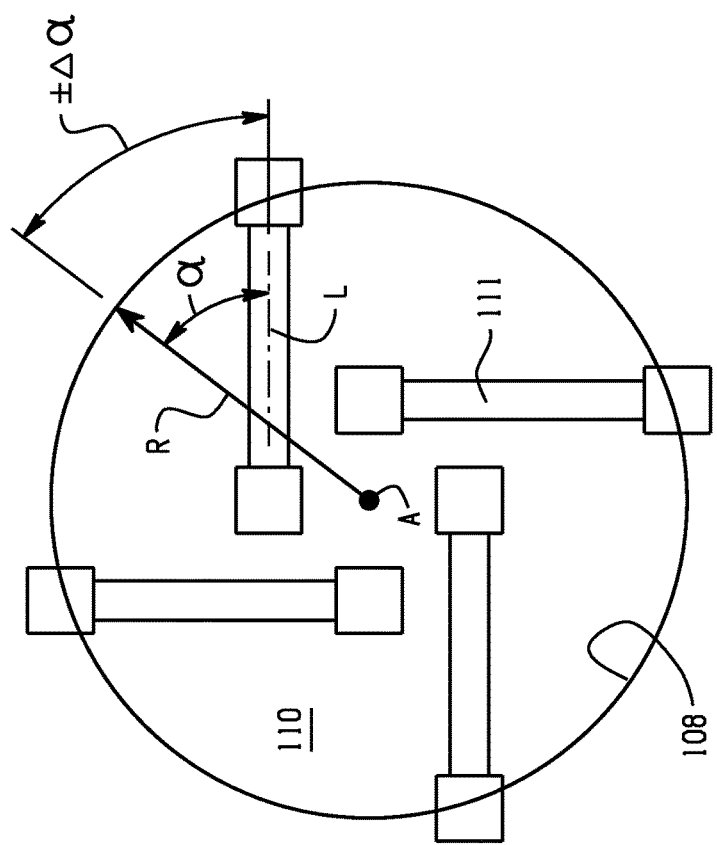

FIG. 3: A simplified and schematic top view on the heater compartment of a wafer holder and temperature conditioning arrangement according to the present invention and as exemplified in FIG. 2 for processing 100 mm diameter wafers.

Figure 4:
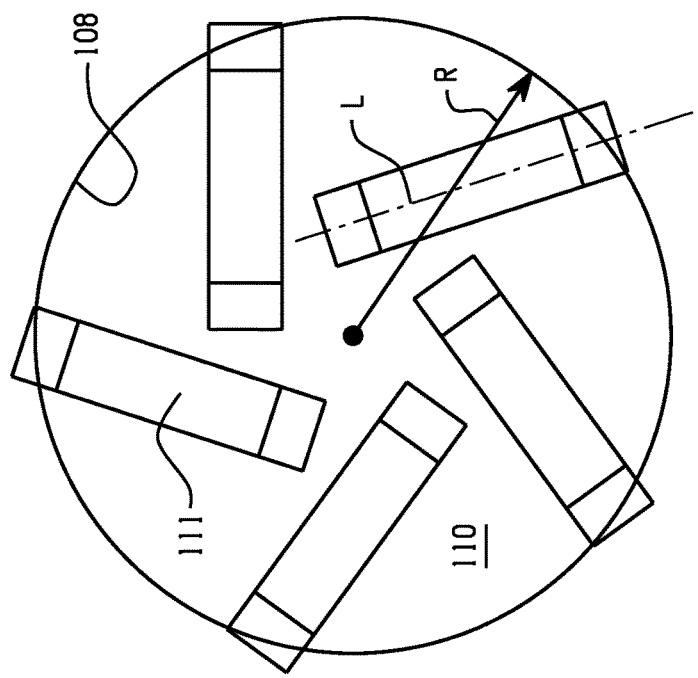

FIG. 4: In a representation in analogy to that of FIG. 3, the arrangement conceived to process 150 mm diameter wafers.

According to FIG. 2, a base arrangement 103 is mounted to the wall 5 of a vacuum processing chamber with the processing span P. The base arrangement 103 of the wafer holder and temperature conditioning arrangement (chuck arrangement) 101 according to the present invention has a substantially planar surface 107, which is bordered by a circular protruding rim surface 108. The rim surface 108 is circular about a central axis A of the substantially planar surface 107 of base arrangement 103. The bin 109 thereby formed in the base arrangement 103 is closed by a circular metal wafer carrier plate 115, which is configured as already explained in context with FIG. 1, with a gas outlet—and distribution—system 128, fed with a back gas through a gas feed line 121 centrally within driver shaft 117 for rotationally driving the metal circular wafer carrier plate 115. Through feed line 121 and the outlet and distribution system 128, a back gas cushion may be applied between top surface of the metal circular wafer carrier plate 115 and a wafer 127 to be processed, as schematically shown from a gas reservoir 123. The driver shaft 117 is driven as schematically shown by motor 119. As already shown in FIG. 1 schematically, vacuum seal 30, 130 respectively, are provided.

The bottom surface 116 of the metal circular wafer carrier plate 115 closes the bin 109, formed in the base arrangement 103 by the rim surface 108 and the substantially planar surface 107, thereby defining for a heat compartment 110: The heat compartment 110 is limited on one side by the drivingly rotatable metal circular wafer carrier plate 115. In the heater compartment 110, a multitude of heater lamp tubes 111 are mounted, the metal circular wafer carrier plate being directly exposed to the heater lamp tubes 111. The mount and electrical connections to the heater lamp tubes 111 are only schematically shown in FIG. 2 at $111_o$ and $111_i$. The surfaces of the bin 109, namely protruding circular rim surface 108 as well as substantially planar surface 107 are realised as heat reflecting surfaces, are preferably high gloss polished.

As it is exemplified in the FIGS. 3 and 4, the heater lamp tubes 111 are all equally oriented with respect to radial direction R from the centre A of the planar surface 107 to the circular rim surface 108. In an arrangement according to the present invention conceived for processing wafers 127 with a diameter of 100 mm, four equal heater lamp tubes 111 with a nominal electric power of 500 W, halogen tubes, are provided in the heater compartment 110. The length axes < of the heater lamp tubes 111 are equally angularly offset by an angle α from the radial direction R. In FIG. 4 and in a representation in analogy to that of FIG. 3, the arrangement according to the invention is conceived for a 150 mm diameter wafer. Five 500 W halogen heater lamp tubes 111 are provided in the heater compartment 110, the length axes < of which being again equally angularly offset with respect to any radial direction R.

In analogy (non represented) an arrangement according to the invention conceived for 200 mm diameter wafers comprises ten heater lamp tubes of 250 W nominal electric power.

As further purely schematically shown in FIG. 2, there is provided a power controller unit 134, by which the electric power delivered to the heater lamp tubes 111 is controlled to provide at the surface of the metal circular wafer carrier plate 115 exposed to wafer 127 a maximum temperature of at least 800° C.

As further schematically shown in FIG. 3, the exact angular position of the length axes > of the heater lamp tubes 111 may be adjusted as shown by ±Δα to optimize homogeneity of heat transfer to the revolving backside of the metal circular wafer carrier plate 115.

Further, in the inventive arrangement, there is provided in the base arrangement 103, as already addressed for the known arrangement according to FIG. 1, a piping of piping 131 for circulating a cooling liquid medium within the base arrangement 103. As may further be seen in FIG. 2, the depth of the bin, formed by rim surface 108 and substantially planar surface 107, substantially accords with the thickness extent of the tubes 111, so that the tubes 111 considered in direction of axis A, fill the heater compartment 110 without contacting on one hand surfaces 108/107 and on the other hand the back surface 116 of metal circular wafer carrier plate 115.

The addressed plate 115 is electrically isolated from base arrangement 103 and the processing chamber with the wall 5 so that (not shown) the wafer carrier plate 115 and thus the wafer carried thereon, may be operated at any desired biasing electric signal. In the embodiment, as exemplified in FIG. 2, the retaining arrangement for the wafer 127 upon the metal circular wafer carrier plate 115 is realised by weight-ring 129 in analogy to the arrangement of FIG. 1. It is also possible to provide the addressed weight-ring 129 with electrical contact, to apply to the wafer 127 via the addressed weight-ring 129 a desired electrical biasing signal (not shown).

With the help of the wafer holder and temperature conditioning arrangement according to the present invention and as exemplified with the help of the FIGS. 2 to 4, it becomes possible to process wafers in the processing chamber at very high temperature of at least 800° C. and thereby to apply to such wafer coatings of materials, which necessitate such very high deposition temperatures. One of such layer materials is lead-zirconatetitanate (PZT) material, which is deposited preferably by cosputtering lead, zirconium and titanium, as for thermo-generator appliances.

Due to the facts that according to the arrangement according to the present invention, first the heat generated by the heater lamp tubes 111 is directly transmitted to the metal circular wafer carrier plate and that secondly the surface of the base arrangement 103, which forms the heat compartment is realised as a heat reflector, the addressed heating of the wafer to very high temperatures is realised. Thereby and compared with the arrangement of FIG. 1, the thermical inertia between heater lamp tubes and wafers are substantially reduced and additionally the overall construction is simplified drastically.

The invention claimed is:

1. A wafer holder and temperature conditioning arrangement to be mounted to a vacuum wafer treatment chamber, comprising:
    a base arrangement mounted to a wall of the vacuum wafer treatment chamber, said base arrangement having an essentially planar surface the outer periphery thereof being bordered by a protruding circular rim surface about a center of said essentially planar surface, wherein said essentially planar surface and said protruding circular rim surface are heat reflector surfaces;
    a metal circular wafer carrier plate centrally mounted with respect to said center of said essentially planar surface, said metal circular wafer carrier plate being drivingly rotatable about a geometric axis through said center of said essentially planar surface with respect to said base arrangement, said protruding circular rim surface curving outwards and upwards away from said essentially planar surface toward a bottom surface of said metal circular wafer carrier plate;
    a heater compartment commonly defined by the bottom surface of said metal circular wafer carrier plate, said essentially planar surface, and said protruding circular rim surface, the heater compartment comprising a multitude of heater tubes mounted to said base arrangement between said essentially planar surface and said bottom surface of said metal circular wafer carrier place, said heater tubes being directly exposed to said bottom surface of said metal circular wafer carrier plate and to said essentially planar surface of said base arrangement; and
    a wafer retaining arrangement operationally coupled to said metal circular wafer carrier plate.

2. The wafer holder and temperature conditioning arrangement of claim 1, further comprising an electric power control unit controlling power to said multitude of heater tubes and configured to operate said multitude of heater tubes to establish along a top surface of said metal circular wafer carrier plate, opposite said bottom surface thereof, a temperature of at least 800° C., averaged over said top surface.

3. The wafer holder and temperature conditioning arrangement of claim 1, wherein said multitude of heater tubes consist of a multitude of equal heater tubes, mounted in said heater compartment equally oriented with respect to a radial direction from said center of said essentially planar surface to said circular rim surface.

4. The wafer holder and temperature conditioning arrangement of claim 3, wherein a length extent direction of said heater tubes is angularly offset from said radial direction.

5. The wafer holder and temperature conditioning arrangement of claim 1, wherein a position of at least a part of said heater tubes in said heater compartment is adjustable.

6. The wafer holder and temperature conditioning arrangement of claim 1, further comprising a gas outlet- and dispensing-arrangement through and along a top surface of said metal circular wafer carrier plate.

7. The wafer holder and temperature conditioning arrangement of claim 1, further comprising a piping arrangement in the base arrangement conceived to flow a liquid herein.

8. The wafer holder and temperature conditioning arrangement of claim 1, wherein said wafer retaining arrangement is a weight-ring dimensioned so as to reside on a periphery of a wafer to be processed.

9. The wafer holder and temperature conditioning arrangement of claim 1, wherein said heater tubes have a thickness that fills said heater compartment without contacting said essentially planar surface or said bottom surface of said metal circular wafer carrier plate.

10. The wafer holder and temperature conditioning arrangement of claim 1, wherein said metal circular wafer carrier plate is electrically isolated from said base arrangement.

11. The wafer holder and temperature conditioning arrangement of claim 1, wherein said wafer carrier plate is configured to carry one of:
    a 100 mm diameter wafer and said multitude of heater tubes consists of four 500 W halogen heater tubes;

a 150 mm diameter wafer and said multitude of heater tubes consists of five 500 W halogen heater tubes; and a 200 mm diameter wafer and said multitude of heater tubes consists of ten 250 W halogen heater tubes.

12. The wafer holder and temperature conditioning arrangement of claim 8, wherein said weight-ring is configured to be electrically connected to an electric bias source.

13. The wafer holder and temperature conditioning arrangement of claim 1, wherein said essentially planar surface and said protruding circular rim surface are high gloss polished.

14. The wafer holder and temperature conditioning arrangement of claim 10, wherein said metal circular wafer carrier plate is configured to be electrically connected to an electric biasing source.

15. The wafer holder and temperature conditioning arrangement of claim 1, wherein said heater tubes are along said bottom surface of said metal circular wafer carrier plate.

16. The wafer holder and temperature conditioning arrangement of claim 1, wherein said protruding circular rim surface is circular about a central axis of the essentially planar surface.

17. The wafer holder and temperature conditioning arrangement of claim 1, wherein the heater compartment is formed as a closed bin between the bottom surface of said metal circular wafer carrier plate, the essentially planar surface of the base arrangement, and the protruding circular rim surface of the base arrangement.

18. The wafer holder and temperature conditioning arrangement of claim 17, wherein a depth of the bin corresponds to a thickness of the heater tubes relative to the geometric axis of the essentially planar surface.

19. The wafer holder and temperature conditioning arrangement of claim 1, wherein the essentially planar surface and the protruding circular rim surface reflect heat generated by the heater tubes directly toward the metal circular wafer carrier plate.

20. The wafer holder and temperature conditioning arrangement of claim 1, wherein the bottom surface of the metal circular wafer carrier plate forms a top wall of, and closes, the heater compartment throughout a duration of a wafer processing.

21. The wafer holder and temperature conditioning arrangement of claim 1, further comprising a gas feed system for establishing, in operation, a cushion of back gas at a pressure larger than an operating vacuum pressure in a processing space of the vacuum wafer treatment chamber.

22. The wafer holder and temperature conditioning arrangement of claim 1, further comprising a driver shaft coaxial to the geometric axis and operationally connected to a motor, wherein the driver shaft and the metal circular wafer carrier plate are electrically isolated from the base arrangement and from the wall of the vacuum processing chamber.

23. The wafer holder and temperature conditioning arrangement of claim 22, further comprising a gas outlet and a gas diverting system with gas distribution grooves provided in a substantially plane surface of the metal circular wafer carrier plate, wherein the driver shaft comprises a coaxial gas feed line operationally connected to a gas source arrangement, said coaxial gas feed line abutting in the gas outlet and the gas diverting system.

* * * * *